US012635317B2

(12) United States Patent
Park et al.

(10) Patent No.: US 12,635,317 B2
(45) Date of Patent: May 19, 2026

(54) LIGHT EMITTING DIODE MODULE AND DISPLAY APPARATUS HAVING THE SAME

(71) Applicant: SAMSUNG ELECTRONICS CO., LTD., Suwon-si (KR)

(72) Inventors: Soowung Park, Suwon-si (KR); Changhoon Kwak, Suwon-si (KR); Kyoungjun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/924,506

(22) Filed: Oct. 23, 2024

(65) Prior Publication Data

US 2025/0248181 A1    Jul. 31, 2025

(30) Foreign Application Priority Data

Jan. 26, 2024    (KR) ........................ 10-2024-0012543

(51) Int. Cl.
| | |
|---|---|
| *H10H 20/00* | (2025.01) |
| *G02F 1/1335* | (2006.01) |
| *G02F 1/13357* | (2006.01) |
| *H10H 20/851* | (2025.01) |
| *H10H 20/856* | (2025.01) |
| *H10H 20/857* | (2025.01) |
| *H10W 90/00* | (2026.01) |

(52) U.S. Cl.
CPC ... *H10H 20/8515* (2025.01); *G02F 1/133603* (2013.01); *G02F 1/133605* (2013.01); *G02F 1/133606* (2013.01); *G02F 1/133612*

(2021.01); *H10H 20/856* (2025.01); *H10H 20/857* (2025.01); *H10W 90/00* (2026.01)

(58) Field of Classification Search
CPC . H10H 20/8515; H10H 20/857; H10H 20/856
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |

(Continued)

FOREIGN PATENT DOCUMENTS

| | | |
|---|---|---|
| CN | 105575957 A | 5/2016 |
| CN | 108011005 A | 5/2018 |

(Continued)

*Primary Examiner* — Gerald J Sufleta, II

(74) *Attorney, Agent, or Firm* — Sughrue Mion, PLLC

(57) ABSTRACT

A light emitting diode (LED) module is provided. The LED module includes: a substrate including upper pads; a passivation layer on the substrate and defining openings exposing the upper pads; an LED chip on the passivation layer and including electrode pads electrically connected to the upper pads of the substrate; an adhesive layer on the LED chip and extending along a side surface of the LED chip; and a phosphor film covering an external surface of the adhesive layer and including an end portion around the LED chip.

20 Claims, 19 Drawing Sheets

(56) References Cited

U.S. PATENT DOCUMENTS

| | | | |
|---|---|---|---|
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 10,193,031 B2 | 1/2019 | Huska et al. | |
| 11,830,967 B2* | 11/2023 | Tamura | H10H 20/856 |
| 2006/0203484 A1* | 9/2006 | Yu | G02F 1/133603 |
| | | | 257/E33.072 |
| 2013/0285087 A1* | 10/2013 | Wang | H10H 20/8514 |
| | | | 257/E33.072 |
| 2015/0085527 A1* | 3/2015 | Nam | H10H 20/851 |
| | | | 438/27 |
| 2018/0366621 A1 | 12/2018 | Yun et al. | |
| 2019/0355783 A1* | 11/2019 | Koh | H10H 20/851 |
| 2023/0246149 A1* | 8/2023 | Kim | H10H 20/814 |
| | | | 257/79 |

FOREIGN PATENT DOCUMENTS

| | | | |
|---|---|---|---|
| CN | 108428696 A | 8/2018 | |
| CN | 111983848 A | 11/2020 | |
| KR | 10-2008-0090379 A | 10/2008 | |
| KR | 10-2008-0092756 A | 10/2008 | |
| KR | 101997244 B1 * | 7/2019 | H10H 20/857 |

* cited by examiner

LIGHT EMITTING DIODE MODULE AND DISPLAY APPARATUS HAVING THE SAME

CROSS-REFERENCE TO RELATED APPLICATION

This application claims priority to Korean Patent Application No. 10-2024-0012543, filed on Jan. 26, 2024, in the Korean Intellectual Property Office, the disclosure of which is incorporated herein by reference in its entirety.

BACKGROUND

The present disclosure relates to a light emitting diode (LED) module and a display apparatus including the same.

Semiconductor light emitting diodes (LEDs) may be used as light sources for lighting devices and light sources for electronic products. For example, semiconductor LEDs may be used as light sources for various display apparatuses, such as televisions (TVs), mobile phones, personal computers (PCs), laptops, and personal digital assistants (PDAs).

Accordingly, methods for providing semiconductor LED modules with a wide beam angle and excellent light extraction efficiency and display apparatuses including the same have been continuously researched.

SUMMARY

One or more embodiments provide a light emitting diode (LED) module with a wide beam angle and excellent light extraction efficiency compared to existing LED modules, and a display apparatus including the same.

According to an aspect of an embodiment, an LED module includes: a substrate including upper pads; a passivation layer on the substrate and defining openings exposing the upper pads; an LED chip on the passivation layer and including electrode pads electrically connected to the upper pads of the substrate; an adhesive layer on the LED chip and extending along a side surface of the LED chip; and a phosphor film covering an external surface of the adhesive layer and including an end portion around the LED chip.

According to an aspect of an embodiment, an LED modules includes: a substrate including upper pads; an LED chip including an active surface on which electrode pads electrically connected to the upper pads are provided, and an inactive surface opposite to the active surface, the active surface facing an upper surface of the substrate; an adhesive layer on the LED chip and extending along a side surface of the LED chip; and a phosphor film covering an external surface of the adhesive layer and including an end portion around the LED chip. The end portion of the phosphor film contacts the upper surface of the substrate and extends between the upper surface of the substrate and lower surfaces of the electrode pads of the LED chip.

According to an aspect of an embodiment, a display apparatus includes: a backlight assembly including a substrate, upper pads on the substrate, a passivation layer on the substrate and defining openings exposing the upper pads, and a plurality of LED modules spaced apart from each other on the passivation layer; and a display panel on the backlight assembly and configured to display an image using light emitted from the plurality of LED modules. Each of the plurality of LED modules of the backlight assembly includes: an LED chip on the passivation layer and including electrode pads; connection bumps in the openings of the passivation layer and electrically connecting the upper pads to the electrode pads; a phosphor film covering the LED chip and including a lower end in contact with at least a portion of the passivation layer; and an adhesive layer between the LED chip and the phosphor film. Adjacent phosphor films among the phosphor film of the each of the plurality of LED modules of the backlight assembly are spaced apart from each other on the substrate.

BRIEF DESCRIPTION OF DRAWINGS

The above and other aspects, features, and advantages will be more apparent from the following description of embodiments, taken in conjunction with the accompanying drawings, in which.

DETAILED DESCRIPTION

Figure 1:
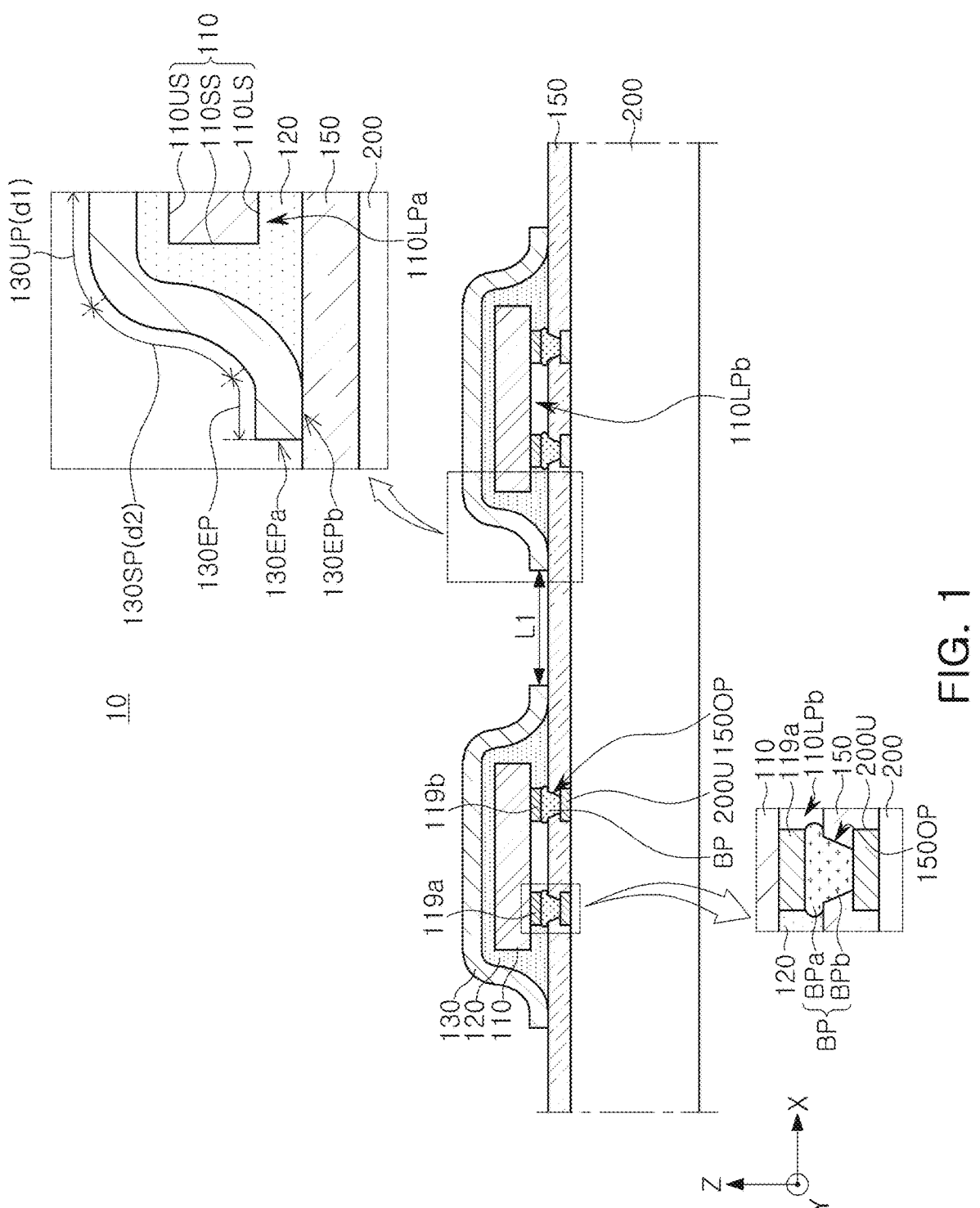
FIG. 1 is a schematic cross-sectional view of a light emitting diode (LED) module according to an embodiment.

Hereinafter, embodiments are described with reference to the accompanying drawings. Like components are denoted by like reference numerals throughout the specification, and repeated descriptions thereof are omitted. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure.

Figure 2:
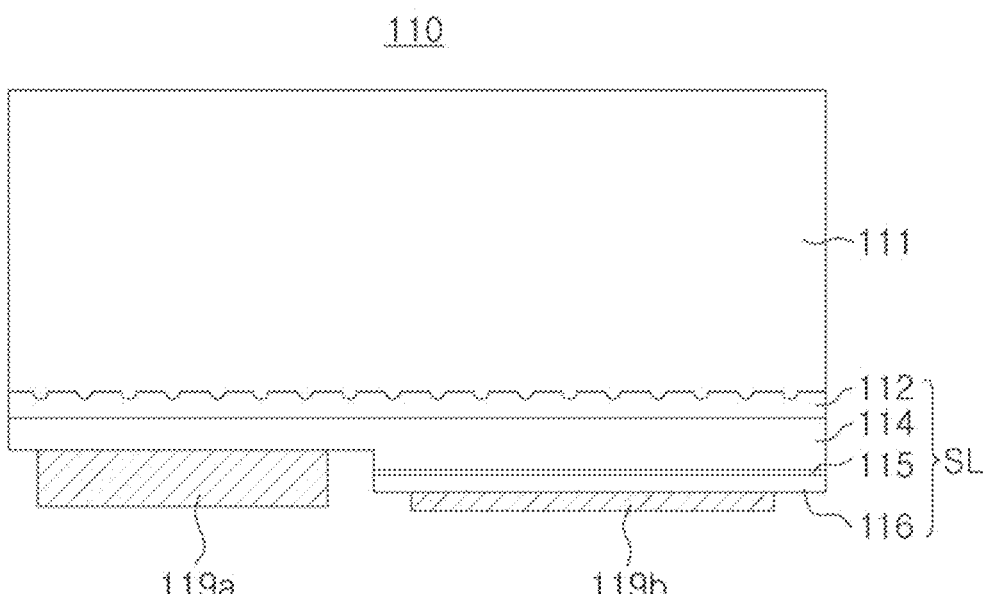
FIG. 2 is a cross-sectional view of a semiconductor light emitting device according to an embodiment.

FIG. 1 is a schematic cross-sectional view of a light emitting diode (LED) module 10 according to an embodiment, and FIG. 2 is a cross-sectional view of a semiconductor light emitting device 110 employed in the LED module 10 of FIG. 1.

Referring to FIGS. 1 and 2, the LED module 10 may include a circuit board 200 including a pad 200U on the top and a plurality of semiconductor light emitting devices 110 disposed on the circuit board 200. Here, the semiconductor light emitting device 110 may be referred to as a semiconductor light emitting device chip or a light emitting device chip (an LED chip). According to an embodiment, the LED module 10 may further include a phosphor film 130 covering the semiconductor light emitting device 110 and an adhesive layer 120 disposed between the semiconductor light emitting device 110 and the phosphor film 130.

The circuit board 200 may include a driving circuit connected to the upper pad 200U and configured to drive the LED module 10. The circuit board 200 may further include other circuits in addition to driving circuits for the LED module.

The circuit board 200 may be formed of various materials, for example, alumina, quartz, calcium zirconate, forsterite, SIC, graphite, fused silica, mullite, cordierite, zirconia, beryllia, aluminum nitride, low temperature co-fired ceramic (LTCC), etc. In addition, the circuit board 200 may be formed of, for example, a square, circular, or polygonal plate, taken in plan view.

The semiconductor light emitting device 110 may be flip-chip bonded to the circuit board 200. For example, electrode pads 119a and 119b of the semiconductor light emitting device 110 may be flip-chip bonded to the upper pads 200U of the circuit board 200 and electrically connected to the driving circuit. The semiconductor light emitting device 110 may be configured to emit blue light by driving current provided from the driving circuit. The semiconductor light emitting device 110 may be configured to emit blue light having a wavelength of 380 nm or higher, for example, 380 nm to 500 nm. The LED module 10 may not include an additional wavelength converter.

Referring to FIG. 2, the semiconductor light emitting device 110 may include a substrate 111 and a semiconductor stack SL disposed on the substrate 111. The semiconductor stack SL may include a first conductivity-type semiconductor layer 114, an active layer 115, and a second conductivity-type semiconductor layer 116 sequentially disposed on the substrate 111. In addition, the semiconductor light emitting device 110 may further include a buffer layer 112 disposed between the substrate 111 and the first conductivity-type semiconductor layer 114.

The substrate 111 may be an insulating substrate, such as sapphire, or a semiconductor substrate, such as silicon (Si). Irregularities may be formed on the upper surface of the substrate 111. The irregularities may improve quality of a grown single crystal while also improving light extraction efficiency.

The buffer layer 112 may include undoped InxAlyGa1-x-yN (0≤x≤1, 0≤y≤1). The buffer layer 112 may be, for example, GaN, AlN, AlGaN, or InGaN. In some embodiments, multiple layers may be combined or the composition may be gradually changed to be used.

The first conductivity-type semiconductor layer 114 may be a nitride semiconductor satisfying N-type $In_xAl_yGa_{1-x-y}N$ (0≤x<1, 0≤y<1, 0≤x+y<1), and N-type impurities may be Si. For example, the first conductivity-type semiconductor layer 114 may include N-type GaN.

The second conductivity-type semiconductor layer 116 may be a nitride semiconductor layer satisfying P-type $In_xAl_yGa_{1-x-y}N$ (0≤x<1, 0≤y<1, 0≤x+y<1), and P-type impurities may be Mg. For example, the second conductivity-type semiconductor layer 116 may be implemented as a single-layer structure, but in some embodiments, the second conductivity-type semiconductor layer 116 may have a multi-layer structure having different compositions.

The active layer 115 may have a multiple quantum well (MQW) structure in which a quantum well layer and a quantum barrier layer are alternately stacked. For example, the quantum well layer and the quantum barrier layer may be $In_xAl_yGa_{1-x-y}N$ (0≤x≤1, 0≤y≤1, 0≤x+y≤1) having different compositions. In some embodiments, the quantum well layer may be $In_xGa_{1-x}N$ (0<x≤1), and the quantum barrier layer may be GaN or AlGaN. A thickness of the quantum well layer and the quantum barrier layer may each range from 1 nm to 50 nm. The active layer 115 is not limited to the multiple quantum well structure and may have a single quantum well structure.

The first and second electrodes 119a and 119b may be disposed in a mesa-etched region of the first conductivity-type semiconductor layer 114 and in the second conductivity-type semiconductor layer 116, respectively, to be located on the same surface. The first electrode 119a may include, but is not limited to, materials, such as Ag, Ni, Al, Cr, Rh, Pd, Ir, Ru, Mg, Zn, Pt, and Au, and may have a structure of a single layer or two or more layers. In some embodiments, the second electrode 119b may include at least one of Al, Au, Cr, Ni, Ti, and Sn.

The LED module 10 may further include a passivation layer 150 disposed on the circuit board 200. For example, the passivation layer 150 may be disposed between the circuit board 200 and the semiconductor light emitting device 110. The passivation layer 150 may protect the upper pads 200U disposed on the circuit board 200. The passivation layer 150 may have a plurality of openings 150OP exposing at least a portion of an upper surface of each of the upper pads 200U.

The passivation layer 150 may include a solder resist including epoxy resin or polyurethane resin, and the passivation layer 150 may be referred to as a solder resist layer. The solder resist layer may be formed using a screen-printing method, a roll coating technique, a curtain cotton technique, and a spray technique, but is not limited thereto. For example, when the solder resist is a dry film, the solder resist layer may be formed by a film lamination technique.

The LED module 10 may further include a connection bump BP disposed between the circuit board 200 and the light emitting device chip 110. The connection bump BP may electrically connect the upper pad 200U of the circuit board 200 to the electrodes 119a and 119b of the light emitting device chip 110. The connection bumps BP may include, for example, tin (Sn), indium (In), bismuth (Bi), antimony (Sb), copper (Cu), silver (Ag), zinc (Zn), lead (Pb) and/or alloys thereof. The alloy may include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, etc. The connection bump BP may have a combination of a metal pillar and a solder ball.

The connection bump BP may include a first structure BPa disposed between an upper surface of the passivation layer 150 and a lower surface 110LS of the light emitting device chip and a second structure BPb penetrating through the passivation layer 150. The first structure BPa may contact the electrodes 119a and 119b of the light emitting device chip 110 and may have a convex shape in a horizontal direction (e.g., an X-direction) on the upper surface of the passivation layer 150. The second structure BPb may extend in a vertical direction downwardly from a lower portion of the first structure BPa and may fill the opening 150OP of the passivation layer 150. The second structure BPb may be disposed to be tapered in a direction vertically away from the upper surface of the passivation layer 150. The lower portion of the second structure BPb may contact the upper pad 200U of the circuit board 200. Accordingly, the connection bump BP may electrically connect the upper pad 200U of the circuit board 200 to the electrodes 119a and 119b of the light emitting device chip 110.

The adhesive layer 120 may surround the light emitting device chip 100 on the passivation layer 150. The adhesive layer 120 may include a resin having adhesive strength and heat resistance, for example, transparent silicone. The adhesive layer 120 may be disposed between the light emitting device chip 100 and the phosphor film 130 to increase adhesive force between the light emitting device chip 100 and the phosphor film 130. In addition, the adhesive layer 120 may be disposed between the passivation layer 150 and the light emitting device chip 100 to increase adhesive force between the light emitting device chip 100 and the phosphor film 130. Accordingly, the adhesive layer 120 may improve the extraction efficiency of light emitted from the light emitting device chip 100 (or the 'LED module 10'). The adhesive layer 120 may be formed by dispensing transparent liquid silicon onto the light emitting device chip 100 through a dispenser.

The adhesive layer 120 may cover at least a portion of the surface of the light emitting device chip 110. For example, the adhesive layer 120 may be disposed on an upper surface 110US of the light emitting device chip and extend downwardly along a side surface 110SS of the light emitting device chip. A lower portion of the adhesive layer 120 may contact an upper surface of the passivation layer 150.

At least a portion of the lower portion of the adhesive layer 120 may extend into the first lower portion 110LPa of the light emitting device chip. Here, the first lower portion 110LPa may be a portion located outside the electrodes 119a and 119b in the lower portion 110LP of the semiconductor light emitting device chip in terms of cross-sectional area. The portion of the adhesive layer 120 extending into the first lower portion 110LPa may contact the lower surface 110LS of the semiconductor light emitting device chip, external surfaces of the electrodes 119a and 119b, and the first structure BPa of the connection bump.

The lower portion of the adhesive layer 120 may not fill the entire second lower portion 110LPb of the light emitting device chip. Here, the second lower portion 110LPb may be a portion located inside the electrodes 119a and 119b in the lower portion 110LP of the semiconductor light emitting device chip, in terms of cross-sectional area. For example, the lower portion of the adhesive layer 120 may fill only a portion of the second lower portion 110LPb of the light emitting device chip.

The phosphor film 130 may be disposed to cover the adhesive layer 120 on the passivation layer 150 and surround the light emitting device chip 110. The phosphor film 130 may include at least one phosphor configured to emit white light when excited by light (hereinafter, referred to as "source light") emitted from the light emitting device chip 110. For example, the phosphor film 130 may include a red phosphor and a green phosphor configured to be excited by the source light (e.g., blue light) and changed into red light and green light, respectively. Accordingly, the phosphor film 130 may emit white light, in which red light, green light, and blue light are combined, in an upward direction. As the phosphor film 130 is disposed to surround the light emitting device chip 110, a beam angle of light emitted from the light emitting device chip 100 (or 'LED module 10') may be widened.

The phosphor film 130 may be disposed to cover an external surface of the adhesive layer 120. The phosphor film 130 may include a first portion 130UP covering a portion of the adhesive layer 120 disposed above the light emitting device chip 110 and having a first thickness d1 and a second portion 130SP extending downwardly along a surface of a portion of the adhesive layer 120 disposed at a side portion of the light emitting device chip 110 and having a second thickness d2.

A thickness of the phosphor film 130 may be about 800 um or less, for example, range from about 10 um to about 800 um, from about 15 um to about 600 um, or from about 20 um to about 500 um. A first thickness d1 of the first portion 130UP of the phosphor film 130 may be a thickness within the above range. Because the second portion 130SP of the phosphor film 130 may be disposed to be inclined on a side portion of the light emitting device chip 110, the second thickness d2 may be different from the first thickness d1, but have substantially the same thickness as the first thickness d1. Here, the substantially same thickness may be defined as a 'difference between the first thickness d1 and the second thickness d2' compared to the 'first thickness d1', and the substantially same thickness may be about 5% or less, for example, 0% or more and about 5% or less, or 0% or more and about 3% or less. Here, the difference between the first thickness d1 and the second thickness d2 may be about 5 um or less, for example, 0 um or more and about 5 um or less, 0 um or more and about 3 um or less, or 0 um or more and about 1 um or less.

The phosphor film 130 covering the light emitting device chip 110 may not extend to cover the light emitting device chip adjacent to the light emitting device chip 110 in a horizontal direction (e.g., the X-direction). In this regard, the phosphor films 130 respectively covering the different adjacent light emitting device chips 110 may be spaced apart from each other by a first distance L1 in the horizontal direction (e.g., the X-direction). Each of the phosphor films 130 may have an end portion 130EP around each of the light emitting device chips 110. Here, the end portion 130EP of the phosphor film 130 may be defined as a portion connected to the end portion of the second portion 130SP of the phosphor film 130. The first distance L1 may be determined according to a horizontal width (hereinafter, referred to as a 'first horizontal width') of the light emitting device chip 110. For example, the first distance L1 may be substantially equal to the first horizontal width or may be less than the first horizontal width. Considering the number of light emitting device chips 110 mounted on the circuit board 200 of the same region, the first distance L1 is preferably about ½ or less of the first horizontal width. More specifically, the first distance L1 may be about 300 um or less, for example, about 50 um or more and about 300 um, about 50 um or more and about 200 um, or about 50 um or more and about 100 um.

The side surface 130EPa of the end portion of the phosphor film may be disposed to face in the horizontal direction (e.g., the X-direction), but is not limited thereto. For example, the side surface 130EPa of the end portion of the phosphor film may be disposed to face in a diagonal direction based on the horizontal direction (e.g., the X-direction). The lower surface 130EPb of the end portion of the phosphor film may contact the upper surface of the passivation layer (150).

The LED module 10 may further include an encapsulating portion surrounding the light emitting device chip 110, the adhesive layer 120, and the phosphor film 130 on the passivation layer 150.

The encapsulating portion may be formed as a dome-shaped lens structure with a convex upper surface, but according to an embodiment, it is possible to adjust a beam angle of light emitted through an upper surface of the encapsulating portion by forming the surface as a convex or concave lens structure.

Figure 3:
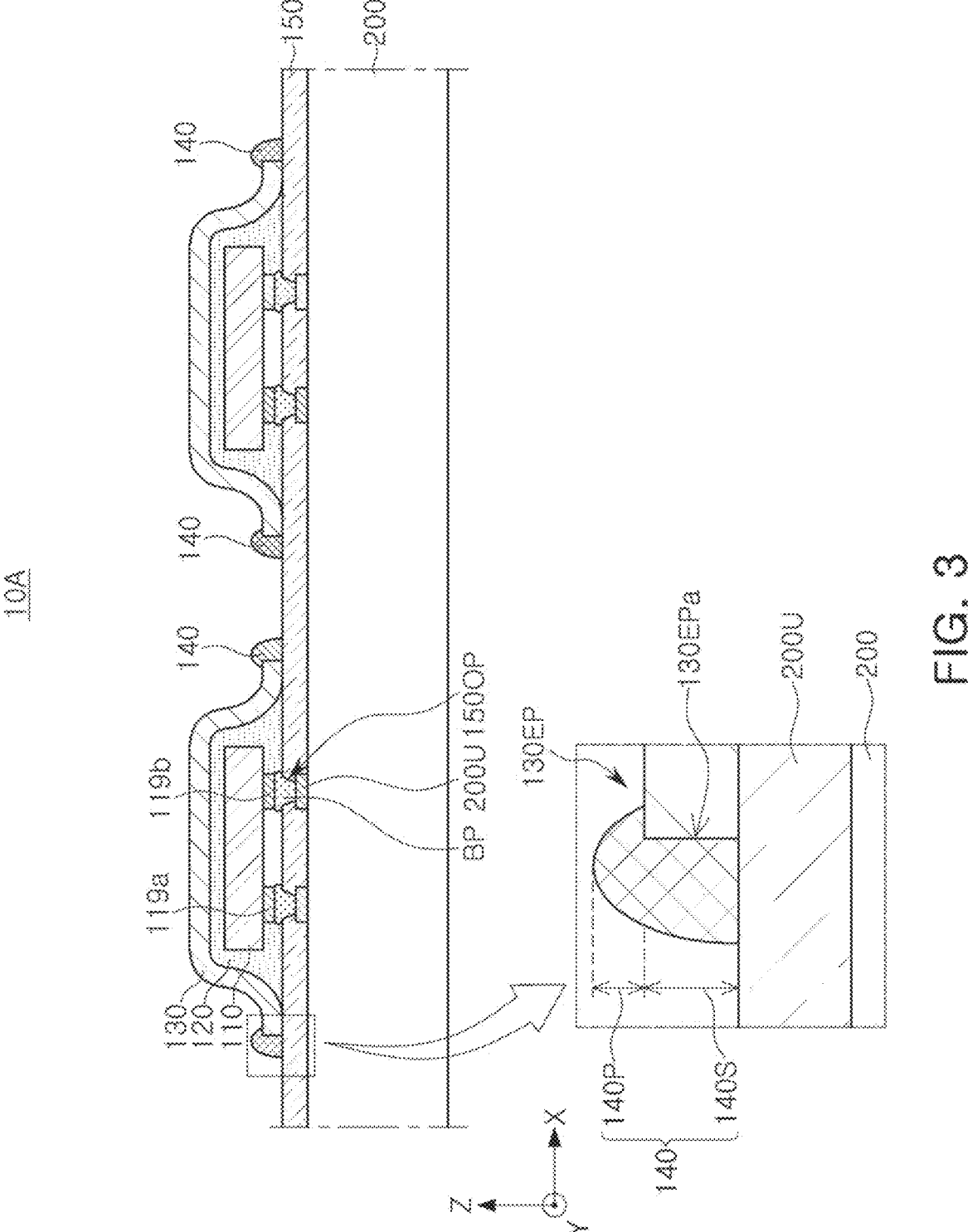
FIG. 3 is a schematic cross-sectional view of an LED module according to an embodiment.

FIG. 3 is a schematic cross-sectional view of an LED module 10A according to an embodiment.

Referring to FIG. 3, the LED module 10A may be the same as or similar to that described above with reference to FIGS. 1 and 2, except that the LED module 10A further includes an additional reflective structure surrounding the light emitting device chip 110.

Referring to FIG. 3, the LED module 10A may further include a reflector 140 covering at least a portion of the end portion 130EP of the phosphor film on the passivation layer 150. In plan view, the reflector 140 may cover the end portion 130EP of the phosphor film and surround the light emitting device chip 110.

The reflector 140 may include a first portion 140S covering the side surface 130EPa of the end portion and a second portion 140P covering an upper portion of the end portion 130EP. The second portion 140P may be formed to be higher than a level of the upper surface of the end portion 130EP, and the second portion 140P may be referred to as a protrusion. As the reflector 140 is disposed to cover the end portion 130EP of the phosphor film, a light leakage phenomenon in which light emitted from the light emitting device chip 110 (or 'LED module 10') occurs near the end portion 130EP may be prevented. The reflector 140 may include a composition having whiteness, heat resistance, and light resistance and have excellent reflectance in a wavelength range of 380 nm to 500 nm. The reflector 140 may include, for example, a white silicone resin composition and/or a white thermosetting silicone resin composition.

Figure 4:
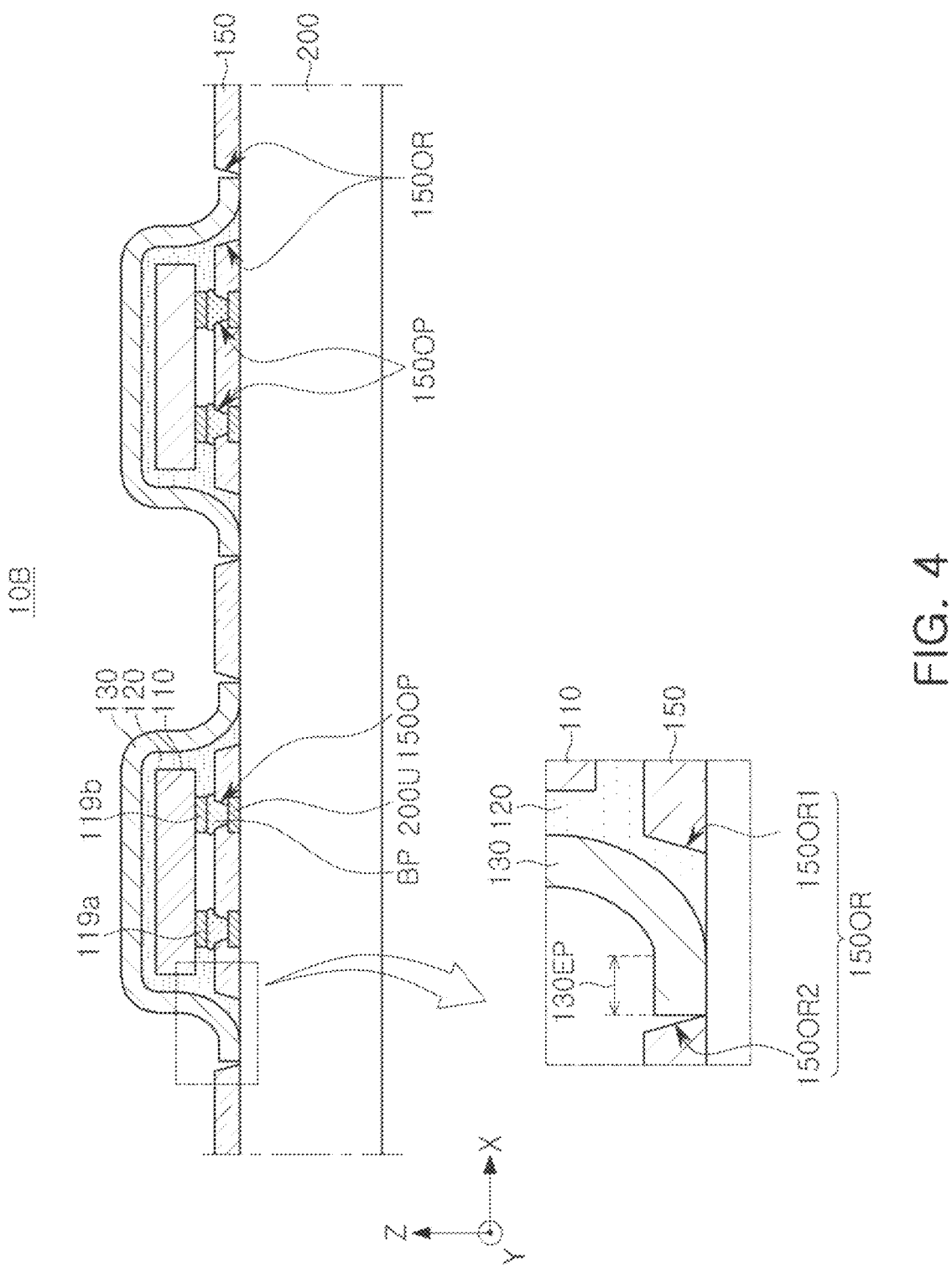
FIG. 4 is a schematic cross-sectional view of an LED module according to an embodiment.

FIG. 4 is a schematic cross-sectional view of an LED module 10B according to an embodiment.

Referring to FIG. 4, the LED module 10B may be the same as or similar to that described above with reference to FIGS. 1 to 3 except that the passivation layer 150 is used as a reflective structure.

Referring to FIG. 4, the passivation layer 150 may have an open region 150OR located outside the openings 150OP. In plan view, the open region 150OR may surround the openings 150OP. A horizontal width of the open region 150OR may be greater than a horizontal width of each of the openings 150OP. The open region 150OR may have a first side 150OR1 located close to the openings 150OP and a second side 150OR2 opposite to the first side 150OR1.

At least a portion of the adhesive layer 120 may be located within the open region 150OR. For example, a lower portion of the adhesive layer 120 may extend downwardly to be disposed within the open region 150OR. Accordingly, the lower portion of the adhesive layer 120 may contact the upper surface of the circuit board 200 and the first side 150OR1 of the open region 150OR.

At least a portion of the phosphor film 130 may also be located within the open region 150OR. For example, the end portion 130EP of the phosphor film may contact the upper surface of the circuit board 200 within the open region 150OR and the second side 150OR2 of the open region 150OR.

As the adhesive layer 120 and the phosphor film 130 are disposed within the open region 150OR, the lowest level of each of the adhesive layer 120 and the phosphor film 130 may be located lower than a level of the upper surface of the passivation layer 150. Accordingly, the beam angle of light emitted from the light emitting device chip 100 (or 'LED module 10') may be widened.

The level of the upper surface of the passivation layer 150 may be higher than the level of upper surface of the phosphor film 130, but is not particularly limited thereto. For example, the level of the upper surface of the passivation layer 150 may be lower than the level of the upper surface of the phosphor film 130. To minimize light leakage that may occur near the end portion 130EP of the phosphor film, the thickness of the passivation layer 150 is preferably about ¼ or more of the thickness of the phosphor film 130. The thickness of the passivation layer 150 may be, for example, about ¼ or more to less than about ¼, or about ¼ to about ½, or about ⅓ to about ½ of the thickness of the phosphor film 130.

Figure 5:
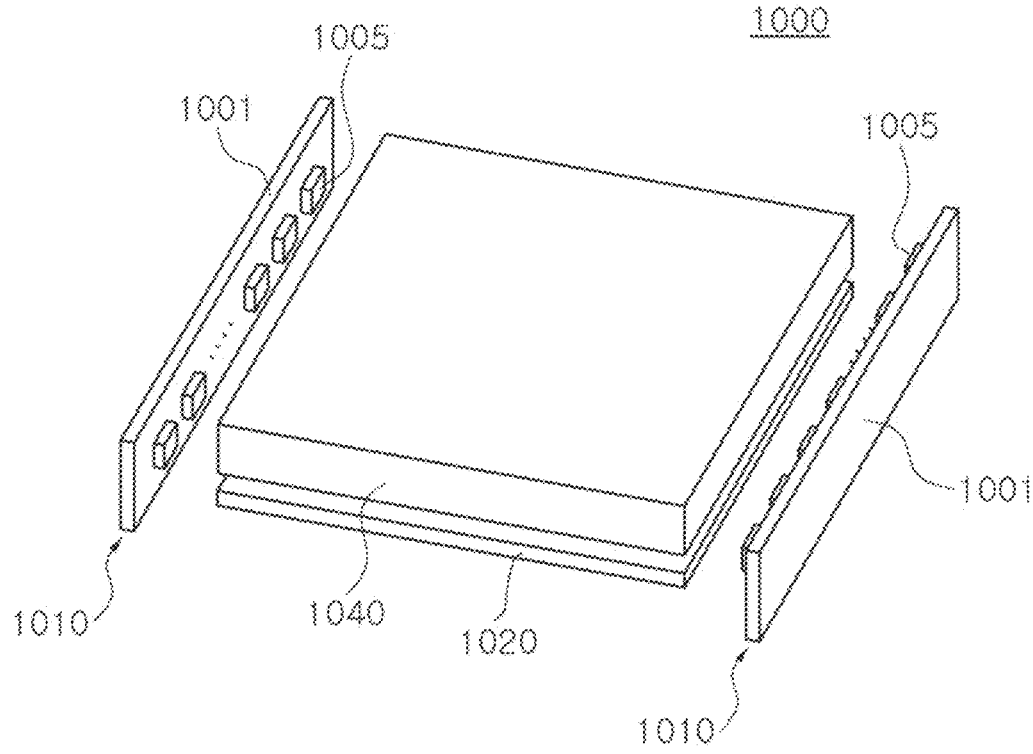
FIG. 5 is a schematic cross-sectional view of a backlight according to an embodiment.

FIG. 5 is a schematic cross-sectional view of a backlight according to an embodiment.

Referring to FIG. 5, a backlight 1000 (or 'backlight assembly') may include a light guide plate 1040 and a light source module 1010 provided on both sides of the light guide plate 1040. In addition, the backlight 1000 may further include a reflector 1020 disposed below the light guide plate 1040. The backlight 1000 may be an edge-type backlight.

According to an embodiment, the light guide plate 1040 may be provided only on one side of the light source module 1010 or may be additionally provided on the other side. The light source module 1010 may include a printed circuit board (PCB) 1001 and a plurality of light emitting devices 1005 mounted on an upper surface of the PCB 1001. The light source module 1010 may include the LED modules 10, 10A, and 10B of FIGS. 1, 3, and 4.

Figure 6:
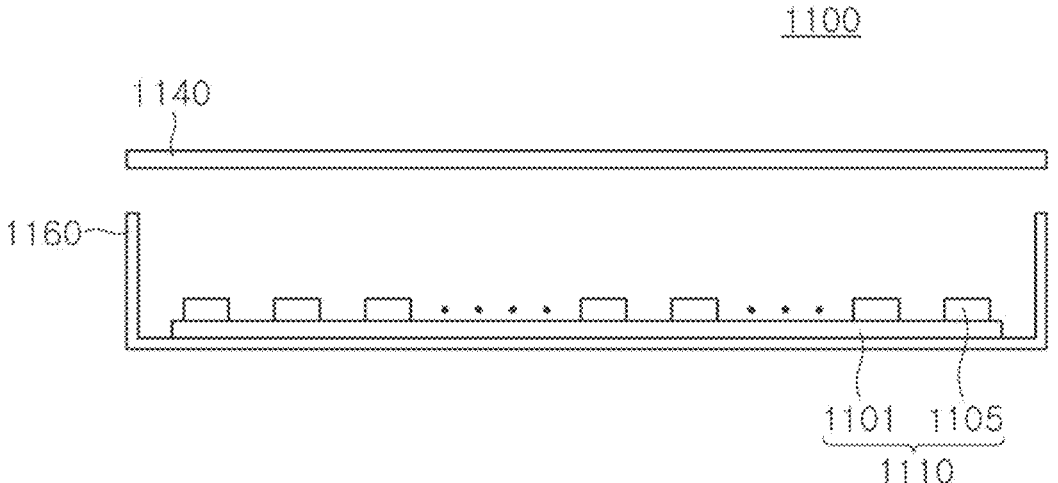
FIG. 6 is a schematic cross-sectional view of a backlight according to an embodiment.

FIG. 6 is a schematic cross-sectional view of a backlight according to an embodiment.

Referring to FIG. 6, a backlight 1100 (or 'backlight assembly') may include a light diffusion plate 1140 and a light source module 1110 arranged below the light diffusion plate 1140. In addition, the backlight 1100 may further include a bottom case 1160 accommodating the light source module 1110. The backlight 1100 may be a direct-type backlight.

The light source module 1110 may include a PCB 1101 and a plurality of light emitting devices 1105 mounted on an upper surface of the PCB 1101. The light source module 1010 may include the LED modules 10, 10A, and 10B of FIGS. 1, 3, and 4.

Figure 7:
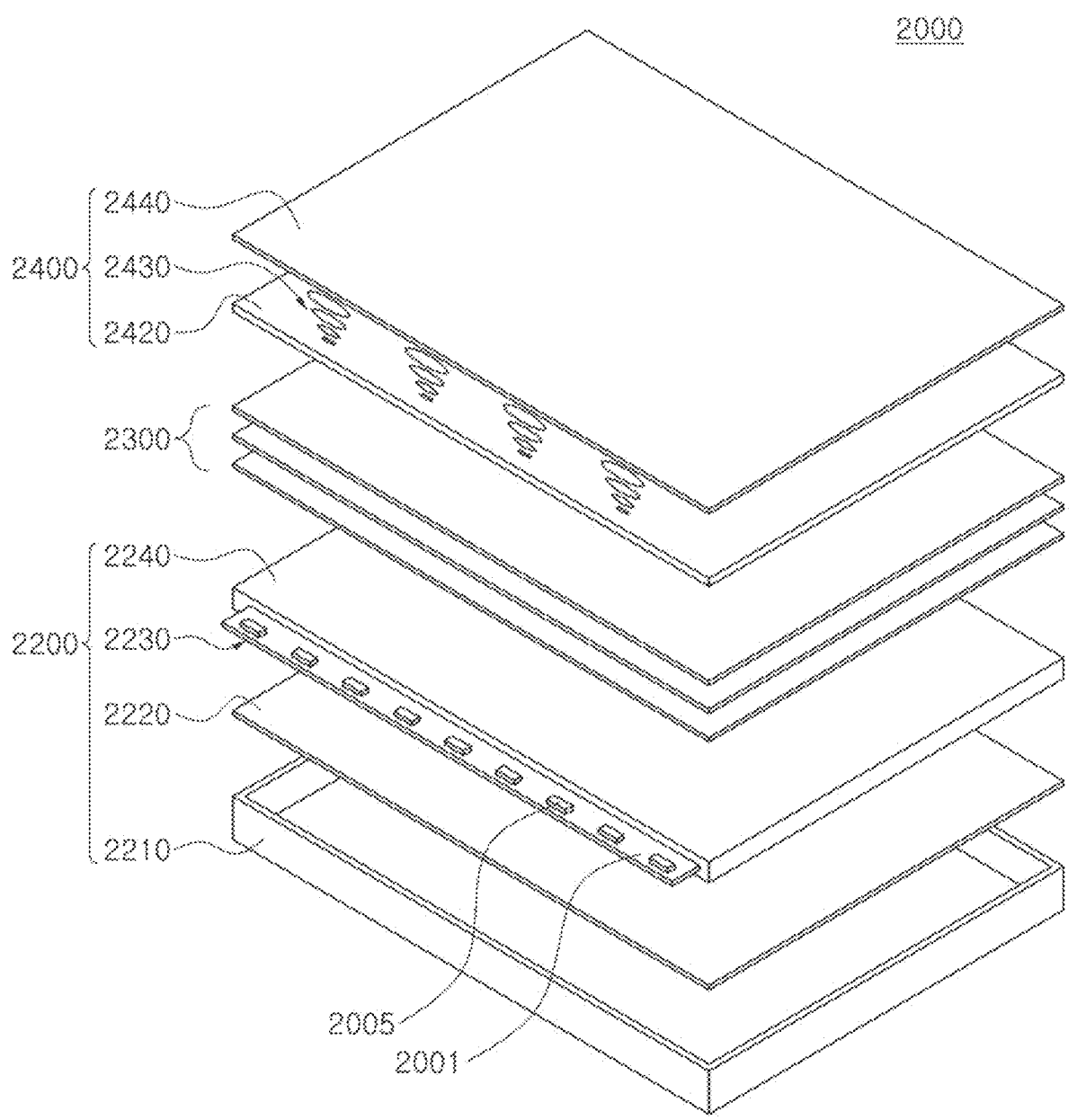
FIG. 7 is an exploded perspective view of a display apparatus according to an embodiment.

FIG. 7 is an exploded perspective view of a display apparatus according to an embodiment.

Referring to FIG. 7, the LED module 10 may be implemented in a display apparatus 2000. The display apparatus 2000 may include a backlight 2200 (or 'backlight assembly'), an optical sheet 2300, and an image display panel 2400, such as a liquid crystal panel.

The backlight 2200 may include a bottom case 2210, a reflector 2220, a light guide plate 2240, and a light source module 2230 provided on at least one side of the light guide plate 2240. The light source module 2230 may include a PCB 2001 and a light emitting device 2005. For convenience, the light emitting device 2005 may include the LED modules 10, 10A, and 10B of FIGS. 1, 3, and 4. In particular, the light emitting device 2005 may be a side view type light emitting device mounted on the side adjacent to a light emitting surface.

The optical sheet 2300 may be disposed between the light guide plate 2240 and the image display panel 2400 and may include various types of sheets, such as diffusion sheets, prism sheets, or protection sheets.

The image display panel 2400 may display an image using light emitted from the optical sheet 2300. The image display panel 2400 may include an array substrate 2420, a liquid crystal layer 2430, and a color filter substrate 2440. The array substrate 2420 may include pixel electrodes arranged in a matrix form, thin film transistors applying a driving voltage to the pixel electrodes, and signal lines for operating the thin film transistors. The color filter substrate 2440 may include a transparent substrate, a color filter, and a common electrode. The color filter may include filters allowing light of a specific wavelength, among white light emitted from the backlight 2200, to selectively pass therethrough. The liquid crystal layer 2430 may be rearranged by an electric field formed between the pixel electrode and the common electrode to adjust light transmittance. Light adjusted in light transmittance may pass through the color filter of the color filter substrate 2440 to display an image. The image display panel 2400 may further include a driving circuit processing image signals.

Figure 8:
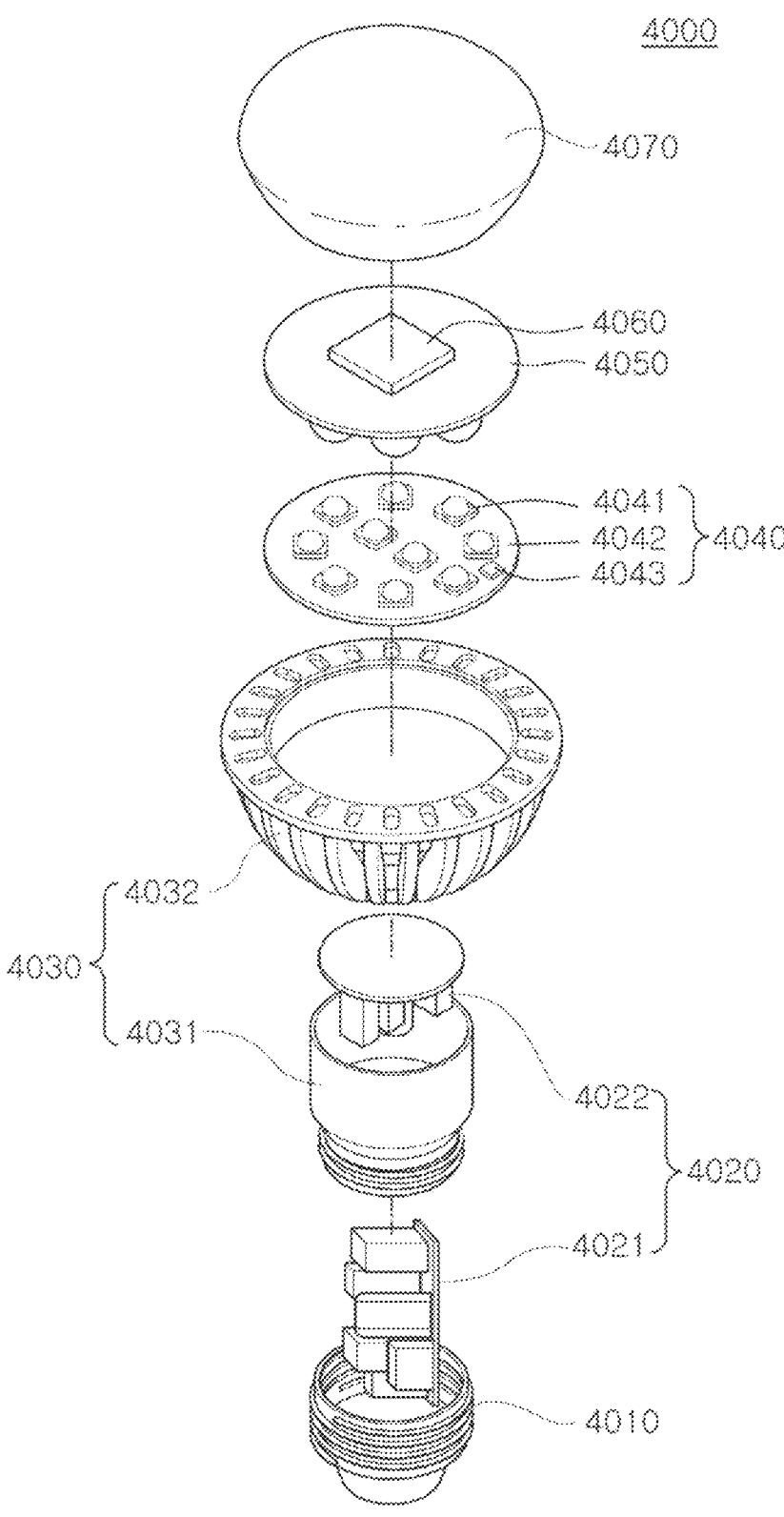
FIG. 8 is a schematic exploded perspective view of a lighting device according to an embodiment.

FIG. 8 is a schematic exploded perspective view of a lighting device according to an embodiment.

Referring to FIG. 8, a lighting device 4000 may include a lamp including a communication module. The lighting device 4000 may include a socket 4010, a power supply 4020, a heat dissipation 4030, a light source module 4040, and a cover 4070. The lighting device 4000 may further include a reflector 4050 and a communication module 4060.

Power supplied to the lighting device 4000 may be applied through the socket 4010. The socket 4010 may be configured to replace existing lighting devices. As illustrated, the power supply 4020 may include a first power supply 4021 and a second power supply 4022 which are assembled. The heat dissipation assembly 4030 may include an internal heat dissipation assembly 4031 and an external heat dissipation assembly 4032. The internal heat dissipation assembly 4031 may be directly connected to the light source module 4040 and/or the power supply 4020, and heat may be transferred to the external heat dissipation assembly 4032 therethrough. The cover 4070 may be configured to evenly distribute light emitted by the light source module 4040.

The light source module 4040 may receive power from the power supply 4020 and emit light to the cover 4070. The light source module 4040 may include one or more light emitting devices 4041, a circuit board 4042, and a controller 4043, and the controller 4043 may store driving information of the light emitting devices 4041. The light source module 4040 may include the LED modules 10, 10A, and 10B of FIGS. 1, 3, and 4.

The reflector 4050 is included on top of the light source module 4040, and the reflector 4050 may reduce glare by evenly spreading light from the light source to the sides and rear. The communication module 4060 may be mounted on top of the reflector 4050, and home-network communication may be implemented through the communication module 4060. For example, the communication module 4060 may be a wireless communication module using Zigbee, Wi-Fi, or Li-Fi, and may control lighting installed inside and outside home, such as turning on or off and brightness control of a lighting device. In addition, electronic products and automobile systems inside and outside home, such as TVs, refrigerators, air-conditioners, door locks, and cars, maybe controlled using a Li-Fi communication module using visible light wavelengths of lighting devices installed inside and outside home. The reflector 4050 and the communication module 4060 may be covered by the cover 4070.

Figure 9:
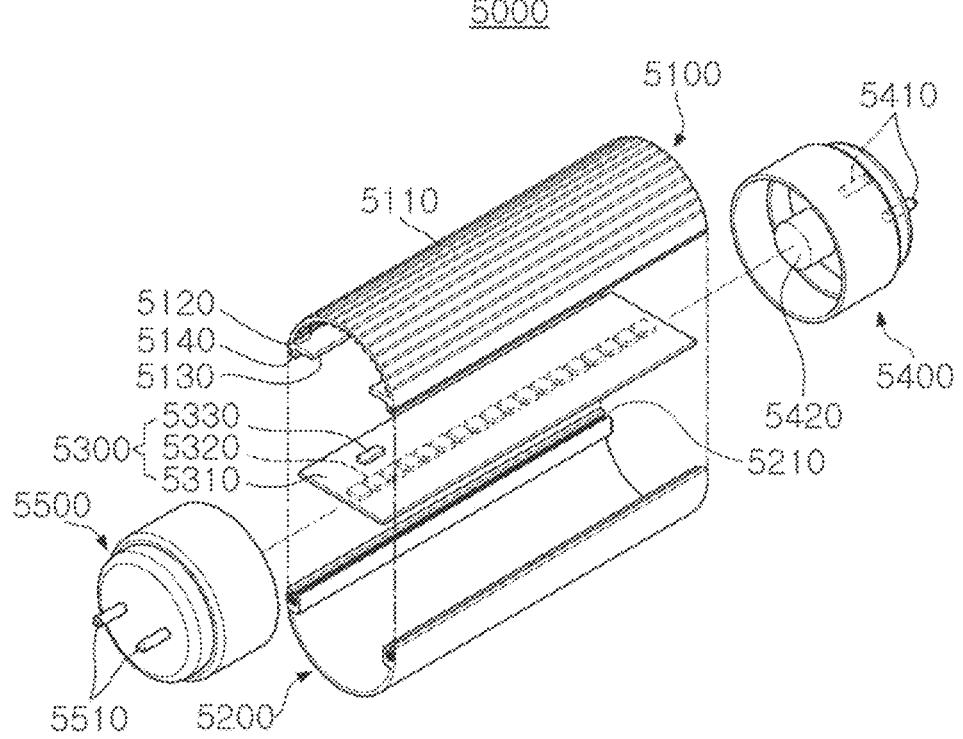
FIG. 9 is a schematic exploded perspective view of a lighting device according to an embodiment.

FIG. 9 is a schematic exploded perspective view of a lighting device according to an embodiment.

Referring to FIG. 9, a lighting device 5000 may include a bar-type lamp. The lighting device 5000 may include a heat dissipation member 5100, a cover 5200, a light source module 5300, a first socket 5400, and a second socket 5500.

A plurality of heat dissipation fins 5110 and 5120 may be formed in an uneven shape on the inner and/or external surface of the heat dissipation member 5100, and the heat dissipation fins 5110 and 5120 may be designed to have various shapes and spacing. A protruding support 5130 is formed inside the heat dissipation member 5100. The light source module 5300 may be fixed to the support 5130. An arrest protrusion 5140 may be formed at both ends of the heat dissipation member 5100.

An arrest groove 5210 may be formed in the cover 5200, and the arrest protrusion 5140 of the heat dissipation member 5100 may be coupled to the arrest groove 5210 using a hook coupling structure. The positions in which the arrest groove 5210 and the arrest protrusion 5140 may be interchanged.

The light source module 5300 may include a light emitting device array. The light source module 5300 may include a PCB 5310, a light source 5320, and a controller 5330. The light source module 4040 may include the LED modules 10, 10A, and 10B of FIGS. 1, 3, and 4. The controller 5330 may store driving information of the light source 5320. Circuit wirings for operating the light source 5320 may be formed on the PCB 5310, and components for operating the light source 5320 may also be included in the PCB 5310.

The first and second sockets 5400 and 5500 are a pair of sockets and have a structure coupled to both ends of a cylindrical cover including the heat dissipation member 5100 and the cover 5200. For example, the first socket 5400 may include an electrode terminal 5410 and a power supply 5420, and a dummy terminal 5510 may be disposed in the second socket 5500. In addition, an optical sensor and/or a communication module may be built into either the first socket 5400 or the second socket 5500. For example, an optical sensor and/or a communication module may be built into the second socket 5500 in which the dummy terminal 5510 is disposed. As another example, an optical sensor and/or a communication module may be built into the first socket 5400 in which the electrode terminal 5410 is disposed.

Figure 10:
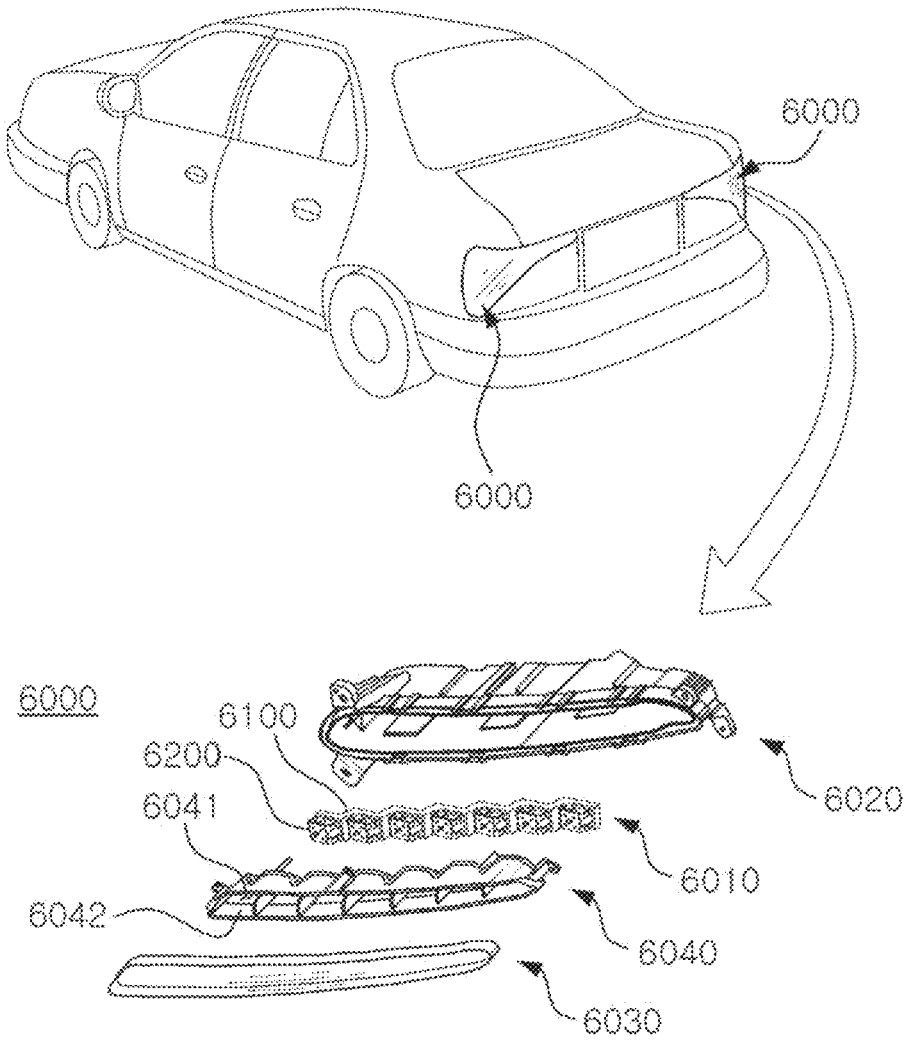
FIG. 10 is a schematic exploded perspective view of a lighting device according to an embodiment.

FIG. 10 is a schematic exploded perspective view of a lighting device according to an embodiment.

Referring to FIG. 10, a lighting device 6000 may include a rear lamp of a car. The lighting device 6000 includes a housing 6020 in which a light source module 6010 is supported and a cover 6030 covering the housing 6020 to protect the light source module 6010, and a reflector 6040 may be disposed on the light source module 6010. The reflector 6040 may include a plurality of reflective surfaces 6042 and a plurality of through-grooves 6041 provided on the bottom of each of the reflective surfaces 6042, and a plurality of light emitters 6200 of the light source module 6010 may be exposed to the reflective surface 6042 through the through-groove 6041.

The lighting device 6000 may have an overall gently curved structure corresponding to the shape of a corner portion of a car, and therefore, the light emitters 6200 may be assembled to a frame 6100 to fit the curved structure of the lighting device 6000 to form a light source module 6010 having a step structure corresponding to the curved structure. The structure of the light source module 6010 may be variously modified depending on the design of the lighting device 6000, that is, the rear lamp. The light source module 6010 may include the LED modules 10, 10A, and 10B of FIGS. 1, 3, and 4. In addition, the number of light emitters 6200 which are assembled accordingly may also vary.

The lighting device 6000 is a rear lamp of a car, but embodiments are not limited thereto. For example, the lighting device 6000 may include a headlamp of a car and a turn signal lamp mounted on a door mirror of a car. The light source module 6010 may be formed to have a multi-step structure corresponding to a curved surface of the head lamp and the turn signal lamp.

FIGS. 11 to 15 are vertical cross-sectional views illustrating a process sequence of a manufacturing method of the LED module 10 according to an embodiment.

Figure 11:
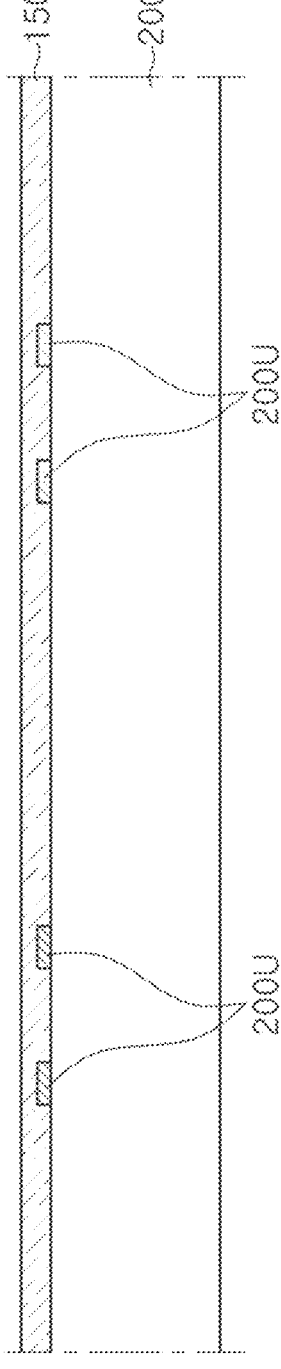
FIGS. 11 to 15 are vertical cross-sectional views illustrating a process sequence of a method of manufacturing an LED module according to an embodiment.

Referring to FIG. 11, a passivation layer 150 may be formed on the circuit board 200.

The passivation layer 150 may be formed on the circuit board 200 to cover the pads 200U disposed on the circuit board 200. The passivation layer 150 may be formed by, for example, a screen-printing method.

Figure 12:
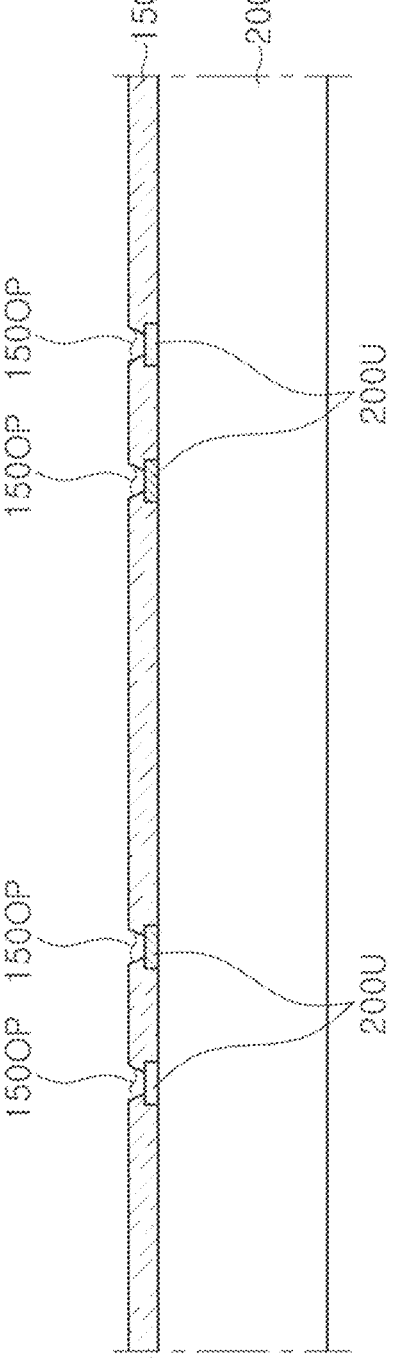

Referring to FIG. 12, a plurality of openings 150OP may be formed to penetrate through the passivation layer 150 and expose the upper surfaces of the upper pads 200U of the circuit board. The openings 150OP may be formed through a photolithography process.

Figure 13:
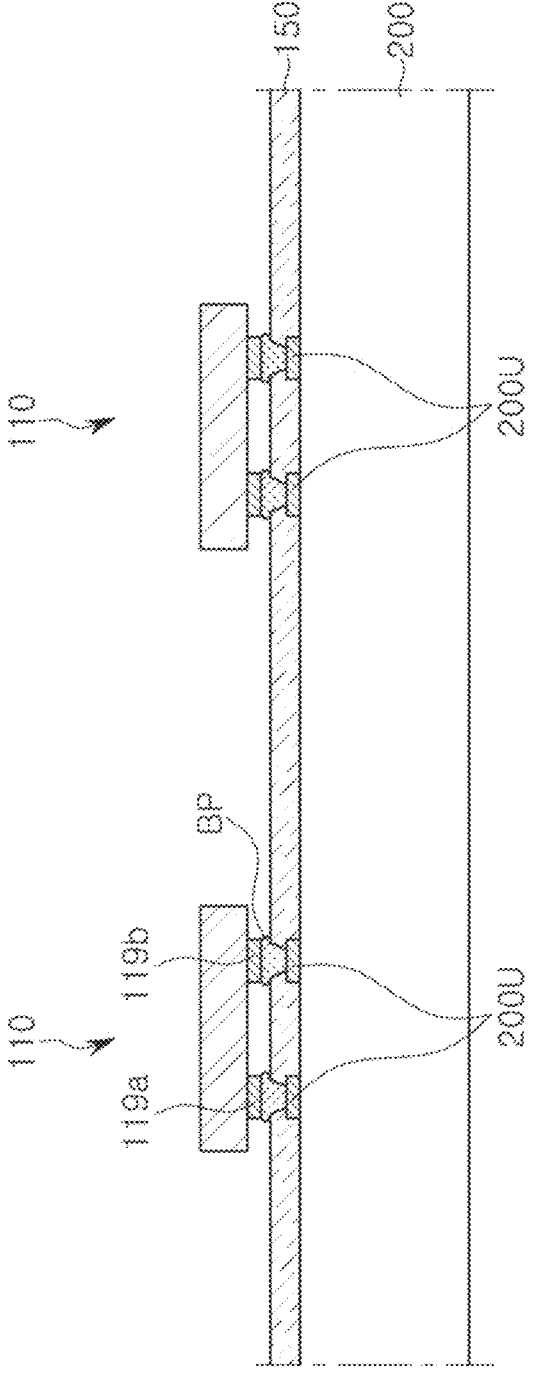

Referring to FIG. 13, the light emitting device chip 110 may be flip-chip bonded to the passivation layer 150.

Referring to FIG. 13, the light emitting device chip 110 with connection bumps BP attached to the lower surfaces of the electrode pads 119a and 119b may be disposed on the passivation layer 150 such that the connection bumps BP are disposed within the openings 150OP. Here, at least a portion of the connection bump BP may protrude from the openings 150OP to be formed on the upper surface of the passivation layer 150 (see FIG. 1).

Figure 14:
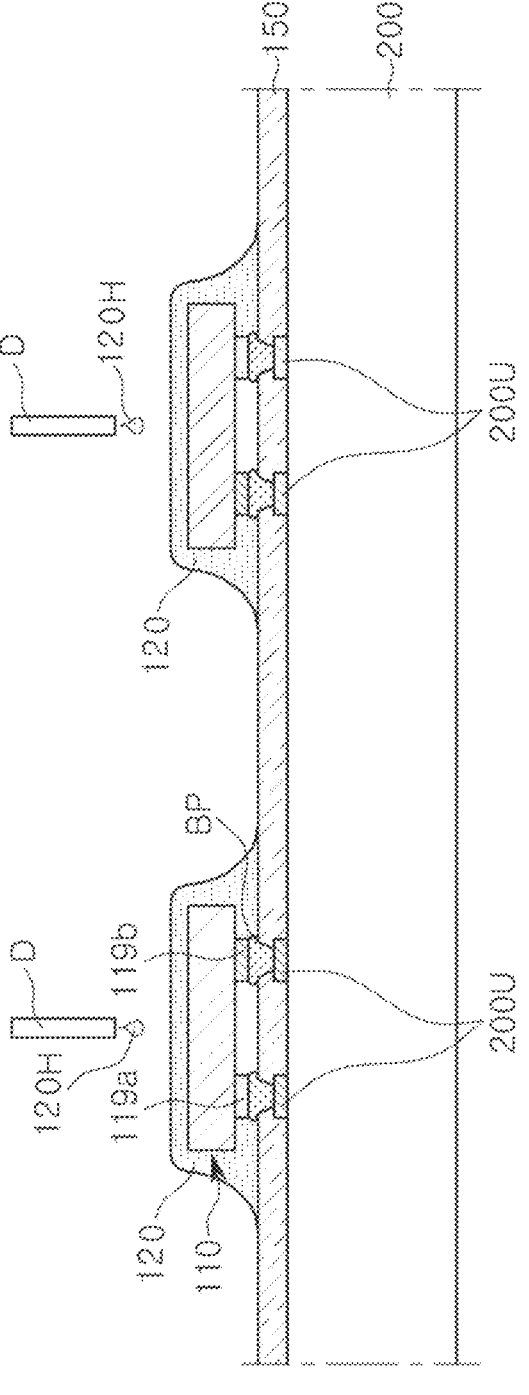

Referring to FIG. 14, the adhesive layer 120 surrounding the light emitting device chip 110 on the passivation layer 150 may be formed.

Referring to FIG. 14, a dispenser D including a composition 120H having adhesiveness (hereinafter referred to as an 'adhesive composition') may be located on the light emitting device chip 110. The adhesive composition 120H may include the liquid transparent silicone composition described above with reference to FIGS. 1 to 4. The adhesive composition 120H may be dispensed onto the light emitting device chip 110 through the dispenser D. The dispensed adhesive composition 120H may flow downwardly along the side of the light emitting device chip 110.

In some embodiments, the dispenser D may be located on the side of the light emitting device chip 110. Accordingly, the adhesive composition 120H may be dispensed from the side of the light emitting device chip 110. Accordingly, adhesion between the passivation layer 150 and the light emitting device chip 110 may be increased by the adhesive composition 120H dispensed from the dispenser D.

Figure 15:
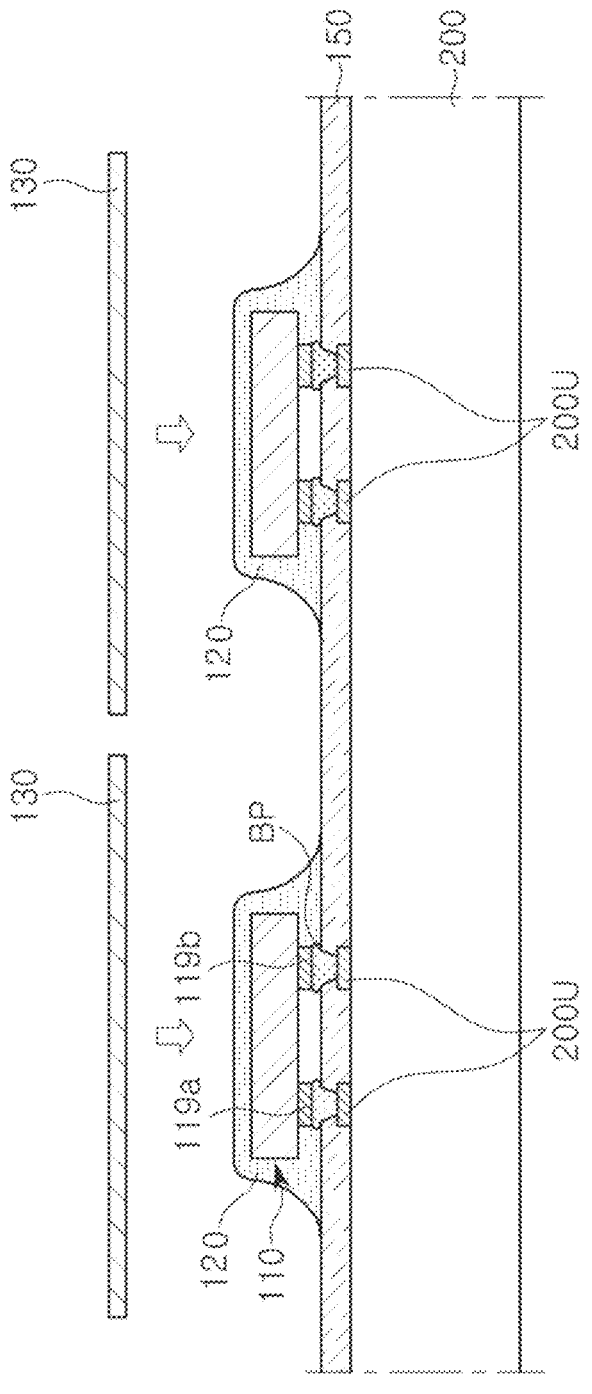

Referring to FIG. 15, the phosphor film 130 may be formed on the passivation layer 150 to cover the adhesive layer 120 and surround the light emitting device chip 110.

Referring to FIG. 15, a plurality of prepared phosphor films may be provided to be located above the light emitting device chips 110, and the plurality of phosphor films 130 may be formed on the light emitting device chips 110 individually. Specifically, the plurality of phosphor films 130 may be formed to cover the light emitting device chips 110, respectively. Here, the plurality of phosphor films 130 may be formed to completely cover the light emitting device chips 110, respectively.

Figure 16:
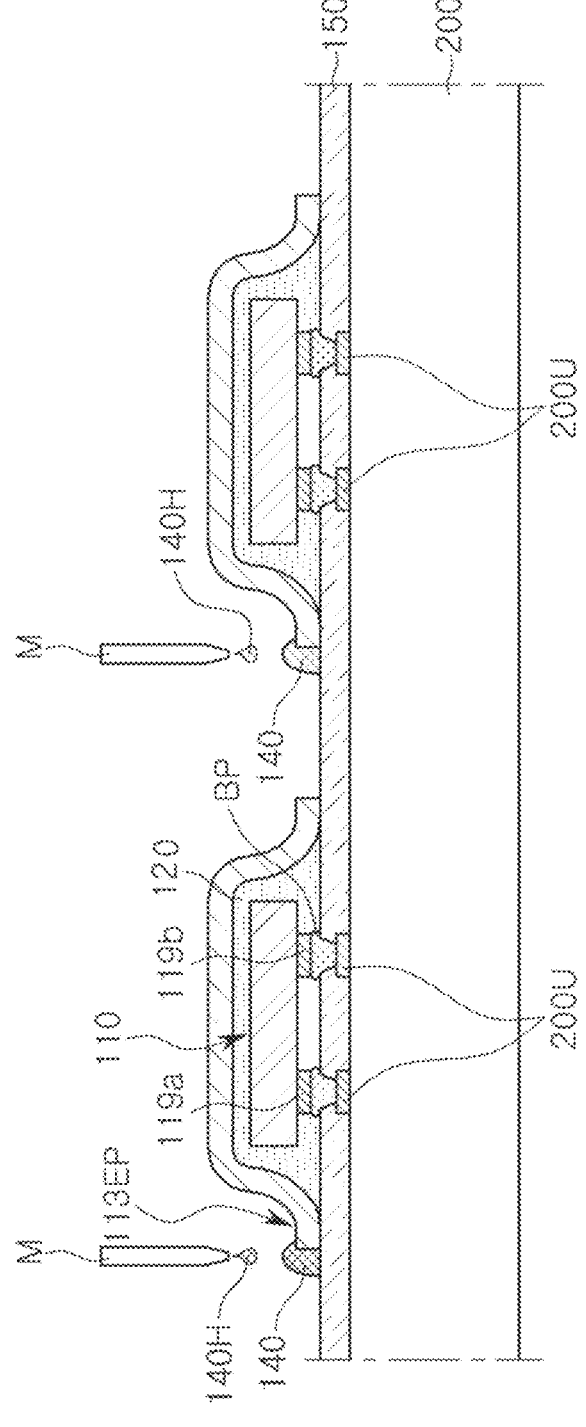
FIG. 16 is a vertical cross-sectional view illustrating a process sequence of a method of manufacturing an LED module according to an embodiment.

FIG. 16 is a vertical cross-sectional view illustrating a process sequence of a manufacturing method of the LED module 10A according to an embodiment. Here, FIG. 16 is a process diagram illustrating a process subsequent to FIG. 15.

Referring to FIG. 16, the reflector 140 may be formed to cover the end portion 130EP of the phosphor film on the passivation layer 150.

Referring to FIG. 16, a dispenser or molder M including a composition 140H having reflectivity (hereinafter referred to as a "reflective composition") may be located above the end portion 130EP of the phosphor film. The reflective composition 140H may include the white silicone resin composition and/or the white thermosetting silicone resin composition described above with reference to FIGS. 1 and 2. The reflective composition 140H may be molded to surround the end portion 130EP of the phosphor film through the molder M.

Figure 17:
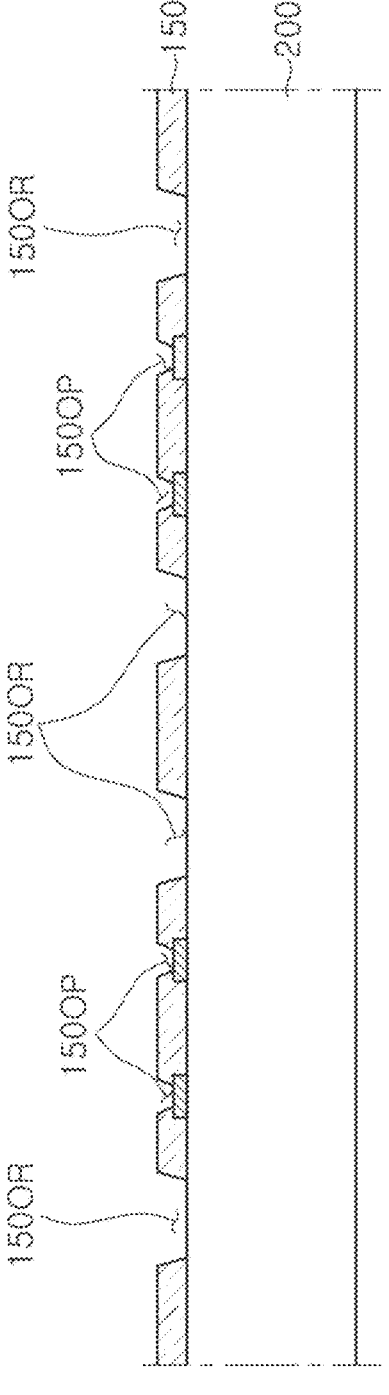
FIGS. 17 to 19 are vertical cross-sectional views illustrating a process sequence of a method of manufacturing an LED module according to an embodiment.
Figure 18:
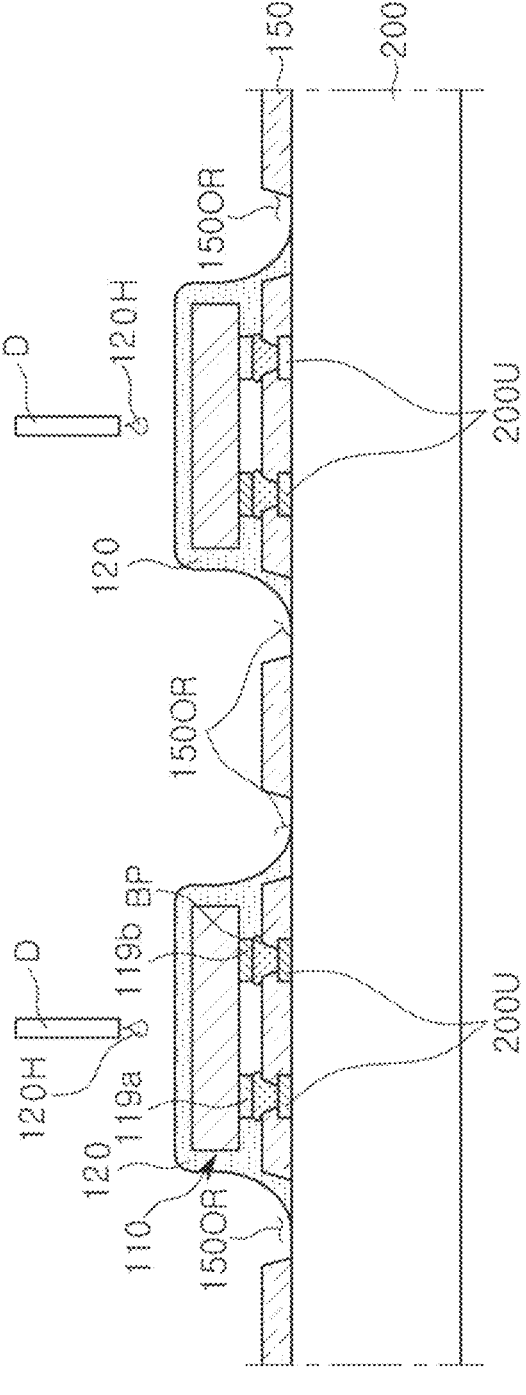
Figure 19:
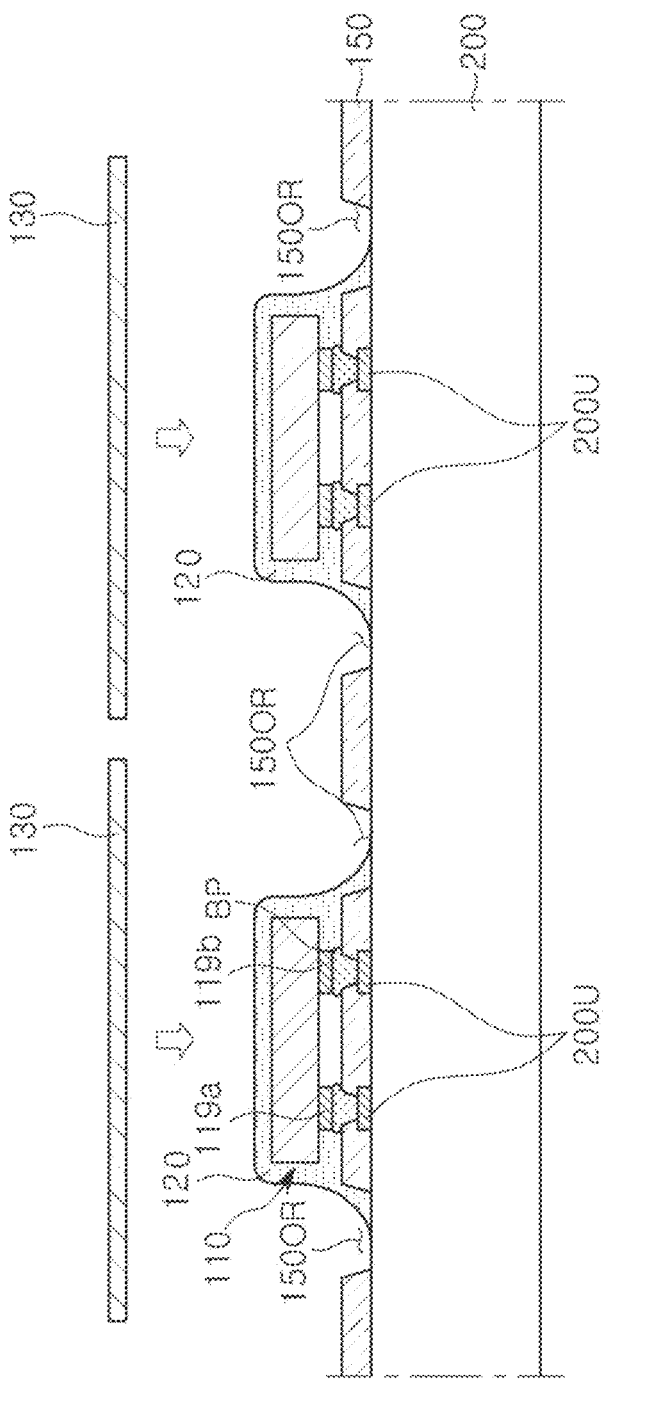

FIGS. 17 to 19 are vertical cross-sectional views illustrating a process sequence of a manufacturing method of the LED module 10B according to an embodiment. Here, FIGS. 17 to 19 are process diagrams illustrating a process subsequent to FIG. 12.

Referring to FIG. 17, the open region 150OR may be formed to penetrate through the passivation layer 150 and expose the upper surface of the circuit board 200.

Referring to FIG. 17, the open region 150OR may be formed along the outer periphery of the plurality of openings 150OP, and a horizontal width of the open region 150OR may be formed to be greater than a horizontal width of each of the plurality of openings 150OP. The open region 150OR may be formed through a photolithography process.

Referring to FIG. 18, similar to FIG. 13, the light emitting device chip 110 may be flip-chip bonded to the passivation layer 150, and similar to FIG. 14, the adhesive layer 120 may be formed to surround the light emitting device chip 110 on the passivation layer 150.

Referring to FIG. 18, the adhesive composition 120H dispensed through the dispenser D may flow downwardly along the side of the light emitting device chip 110 and may be formed within the open region 150OR of the passivation layer 150. Similarly, the dispenser D may be located on the side of the light emitting device chip 110.

Referring to FIG. 19, similar to FIG. 15, the phosphor film 130 may be formed to cover the adhesive layer 120 and surround the light emitting device chip 110 on the passivation layer 150.

Referring to FIG. 19, the phosphor film 130 may be formed on the adhesive layer 120 to completely cover the light emitting device chip 110. The end portion 130EP of the phosphor film may be located within the open region 150OR of the passivation layer 150. Here, a side surface 130SS of the end portion may contact the side surface of the passivation layer 150 within the open region 150OR (see FIG. 4).

According to embodiments, the LED module capable of reducing the limitations of a beam angle and improving light extraction efficiency by including the phosphor film individually surrounding each of the plurality of semiconductor light emitting device chips on the circuit board, and the display apparatus including the LED module may be provided.

In addition, the LED module capable of minimizing light leakage by disposing the reflective structure covering the end portion of the phosphor film on the circuit board, and the display apparatus including the same may be provided.

While aspects of embodiments have been particularly shown and described, it will be understood that various changes in form and details may be made therein without departing from the spirit and scope of the following claims.

What is claimed is:

1. A light emitting diode (LED) module comprising:
   a substrate comprising upper pads;
   a passivation layer on the substrate and defining openings exposing the upper pads;
   a plurality of LED chips on the passivation layer, wherein the plurality of LED chips comprises an LED chip, and the LED chip comprises electrode pads electrically connected to the upper pads of the substrate;
   an adhesive layer on the LED chip and extending along a side surface of the LED chip; and
   a phosphor film covering an external surface of the adhesive layer and comprising an end portion around the LED chip, wherein the end portion extends along the external surface of the adhesive layer to contact at least a portion of the passivation layer,
   wherein the phosphor film of the LED chip is spaced apart from phosphor films of adjacent LED chips among the plurality of LED chips.

2. The light emitting diode module of claim 1, wherein the LED chip comprises an active surface on which the electrode pads are provided and an inactive surface opposite to the active surface, and
   wherein the active surface faces an upper surface of the passivation layer.

3. The light emitting diode module of claim 2, further comprising connection bumps in the openings of the passivation layer,
   wherein the connection bumps electrically connect the upper pads of the substrate to the electrode pads of the LED chip.

4. The light emitting diode module of claim 1, wherein the LED chip comprises a light emitting device configured to emit source light, and
   wherein the phosphor film comprises a phosphor configured to be excited by the source light and emit white light.

5. The light emitting diode module of claim 1, wherein the LED chip comprises a blue light emitting device configured to emit blue light, and
   wherein the phosphor film comprises a red phosphor and a green phosphor.

6. The light emitting diode module of claim 1, wherein the phosphor film comprises a first portion on top of the adhesive layer and a second portion extending from an end of the first portion along a side of the adhesive layer, and
   wherein the first portion and the second portion have a substantially similar thickness.

7. The light emitting diode module of claim 1, wherein a thickness of the phosphor film is 20 μm to 500 μm.

8. The light emitting diode module of claim 7, wherein the phosphor film comprises a first portion on top of the adhesive layer and a second portion extending from an end of the first portion along a side of the adhesive layer,
   wherein the first portion has a first thickness and the second portion has a second thickness, and
   wherein a difference between the first thickness and the second thickness is 5 μm or less.

9. The light emitting diode module of claim 1, further comprising a reflector surrounding the LED chip on the passivation layer and covering a side surface of the end portion of the phosphor film in plan view.

10. The light emitting diode module of claim 9, wherein the reflector has a protrusion covering at least a portion of an upper surface of the end portion.

11. The light emitting diode module of claim 9, wherein the reflector comprises a white silicone resin composition.

12. The light emitting diode module of claim 1, wherein the passivation layer further defines an open region surrounding the openings and exposing at least a portion of an upper surface of the substrate,
   wherein a lower portion of the adhesive layer extends to the open region of the passivation layer, and
   wherein the end portion of the phosphor film contacts at least the portion of the upper surface of the substrate within the open region of the passivation layer.

13. The light emitting diode module of claim 12, wherein the open region of the passivation layer has a first side and a second side opposite to the first side,
   wherein the lower portion of the adhesive layer contacts the first side of the open region, and
   wherein the end portion of the phosphor film contacts at least a portion of the second side of the open region.

14. The light emitting diode module of claim 12, wherein a thickness of the passivation layer is ¼ or more of a thickness of the phosphor film.

15. A light emitting diode (LED) module comprising:
   a substrate comprising upper pads;
   a plurality of LED chips on the substrate, wherein the plurality of LED chips comprises an LED chip, the LED chip comprises an active surface on which electrode pads electrically connected to the upper pads are provided, and an inactive surface opposite to the active surface, and the active surface faces an upper surface of the substrate;
   an adhesive layer on the LED chip and extending along a side surface of the LED chip; and
   a phosphor film covering an external surface of the adhesive layer and comprising an end portion around the LED chip,
   wherein the end portion of the phosphor film extends along the external surface of the adhesive layer to contact a passivation layer on the upper surface of the substrate, and the end portion of the phosphor film extends between the upper surface of the substrate and lower surfaces of the electrode pads of the LED chip, and
   wherein the phosphor film of the LED chip is spaced apart from phosphor films of adjacent LED chips among the plurality of LED chips.

16. The light emitting diode module of claim 15, further comprising connection bumps between the substrate and the LED chip, and electrically connecting the upper pads to the electrode pads,
   wherein the adhesive layer contacts at least a portion of a lower surface of the LED chip and a portion of side surfaces of the connection bumps.

17. The light emitting diode module of claim 15, further comprising a reflector surrounding the LED chip on the substrate in plan view,
   wherein the reflector covers at least a portion of side and upper surfaces of the end portion of the phosphor film.

18. The light emitting diode module of claim 15,
   wherein the passivation layer defines openings between the substrate and the LED chip, and an open region surrounding the openings, wherein the light emitting diode module further comprises connection bumps within the openings of the passivation layer and electrically connecting the upper pads to the electrode pads, and wherein the end portion of the phosphor film is within the open region of the passivation layer.

19. A display apparatus comprising:

a backlight assembly comprising a substrate, upper pads on the substrate, a passivation layer on the substrate and defining openings exposing the upper pads, and a plurality of light emitting diode (LED) modules spaced apart from each other on the passivation layer; and a display panel on the backlight assembly and configured to display an image using light emitted from the plurality of LED modules, wherein each of the plurality of LED modules of the backlight assembly comprises:

an LED chip on the passivation layer and comprising electrode pads;

connection bumps in the openings of the passivation layer and electrically connecting the upper pads to the electrode pads;

a phosphor film covering the LED chip and comprising a lower end; and an adhesive layer between the LED chip and the phosphor film, wherein the lower end of the phosphor film extends along an external surface of the adhesive layer to contact at least a portion of the passivation layer;

wherein adjacent phosphor films among the phosphor film of the each of the plurality of LED modules of the backlight assembly are spaced apart from each other on the substrate.

20. The display apparatus of claim 19, wherein each of the plurality of LED modules of the backlight assembly further comprises a reflective structure surrounding at least a portion of the lower end of the phosphor film on the passivation layer in plan view.

* * * * *